United States Patent
Kazuya et al.

(10) Patent No.: US 8,836,208 B2
(45) Date of Patent: Sep. 16, 2014

(54) LIGHT-EMITTING DEVICE INCLUDING LED ELEMENT WHOSE UPPER SURFACE IS FREE FROM WHITE RESIN AND METHOD OF MANUFACTURING THE SAME

(75) Inventors: Ishihara Kazuya, Tsuru (JP); Yuki Suto, Fujiyoshida (JP); Yusuke Watanabe, Fujiyoshida (JP)

(73) Assignees: Citizen Electronics Co., Ltd., Yamanashi-Ken (JP); Citizen Holdings Co., Ltd., Tokyo (JP)

( * ) Notice: Subject to any disclaimer, the term of this patent is extended or adjusted under 35 U.S.C. 154(b) by 0 days.

(21) Appl. No.: 13/525,934

(22) Filed: Jun. 18, 2012

(65) Prior Publication Data

US 2012/0319563 A1    Dec. 20, 2012
US 2013/0127328 A2    May 23, 2013

(30) Foreign Application Priority Data

Jun. 17, 2011 (JP) ................. 2011-135526

(51) Int. Cl.
*H01J 1/62* (2006.01)
*H01J 9/00* (2006.01)

(52) U.S. Cl.
USPC .............. 313/498; 313/512; 313/511; 445/23

(58) Field of Classification Search
CPC .............. H01J 1/62; H01J 9/00; H01L 21/56; H01L 21/563
USPC ............. 313/498, 500–512; 445/58; 257/784, 257/40, 98–99
See application file for complete search history.

(56) References Cited

U.S. PATENT DOCUMENTS 7,334,907 B2   2/2008   Nagayama
2008/0186714 A1   8/2008   Nagayama

FOREIGN PATENT DOCUMENTS

JP   2005277227 A   10/2005
JP   2007019096 A   1/2007
JP   2010192629 A   9/2010

OTHER PUBLICATIONS

Matsumoto Kimiki, Japanese Patent Application Publication 2010-192629, Feb. 2010, machine translation.*

* cited by examiner

*Primary Examiner* — Tracie Y Green
(74) *Attorney, Agent, or Firm* — Browdy and Neimark, PLLC

(57) ABSTRACT

A light-emitting device includes a substrate that includes at least a pair of electrodes, an LED element electrically mounted on the substrate, a phosphor plate adhered to an upper surface of the LED element and including an upper surface and a lower surface each having an area larger than that of the upper surface of the LED element, a white resin provided on an upper surface of the substrate and seamlessly covering a peripheral side surface of the LED element and a peripheral side surface of the phosphor plate. A lower surface of the phosphor plate is adhered to the upper surface of the LED element through a transparent adhesive.

9 Claims, 10 Drawing Sheets

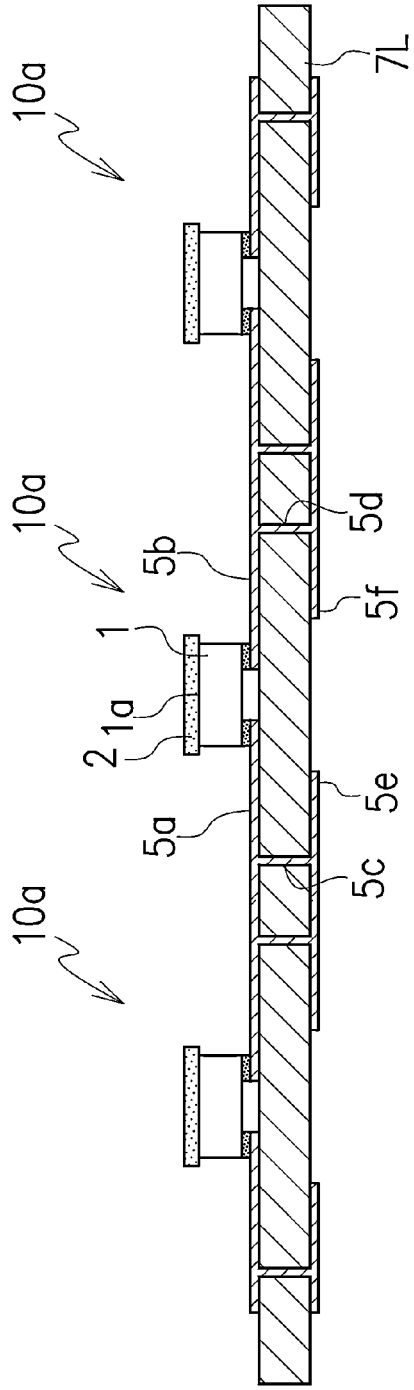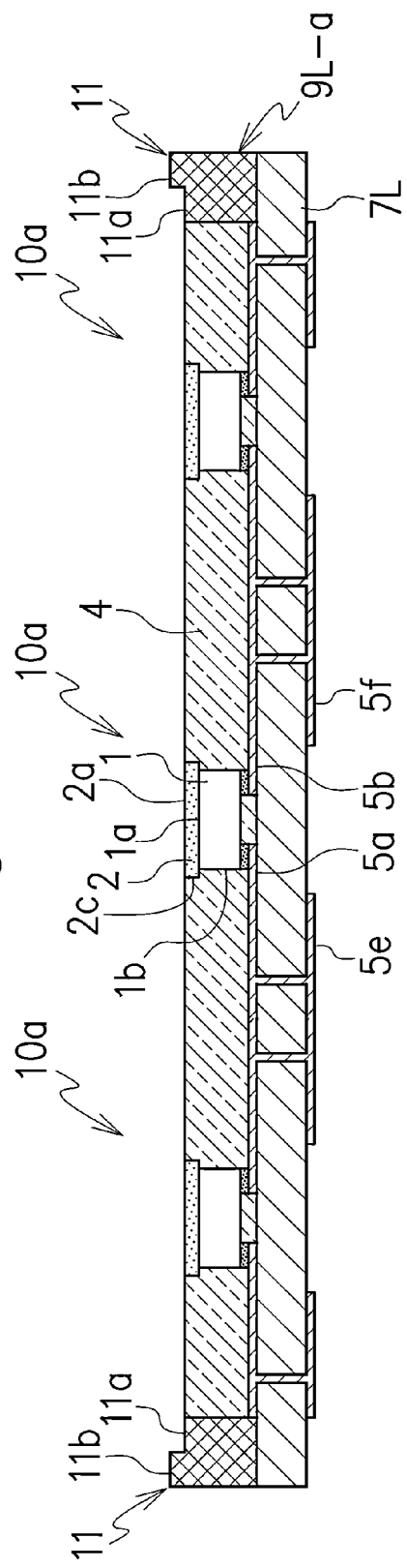

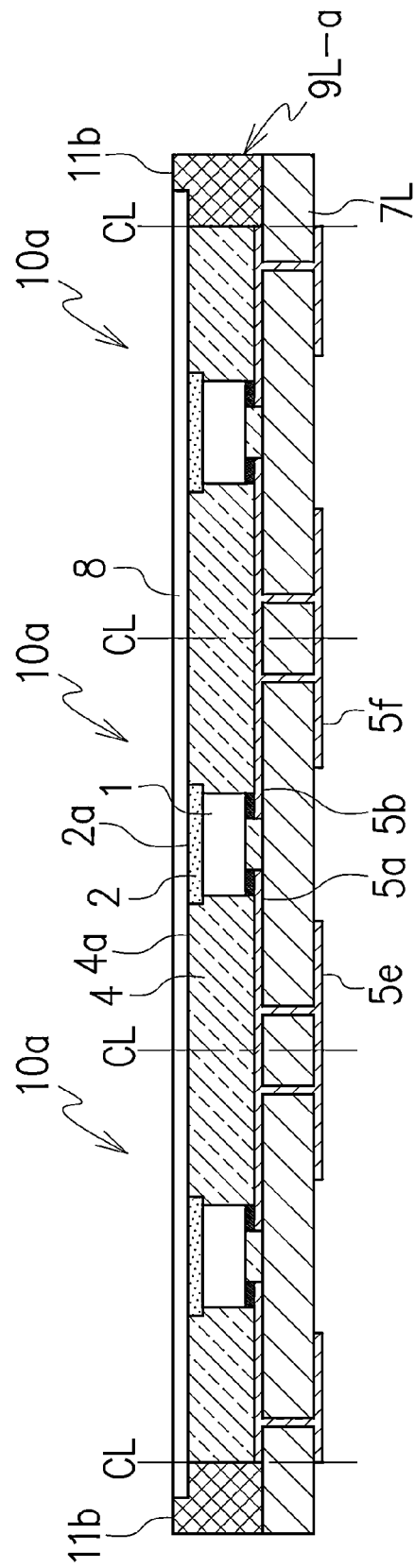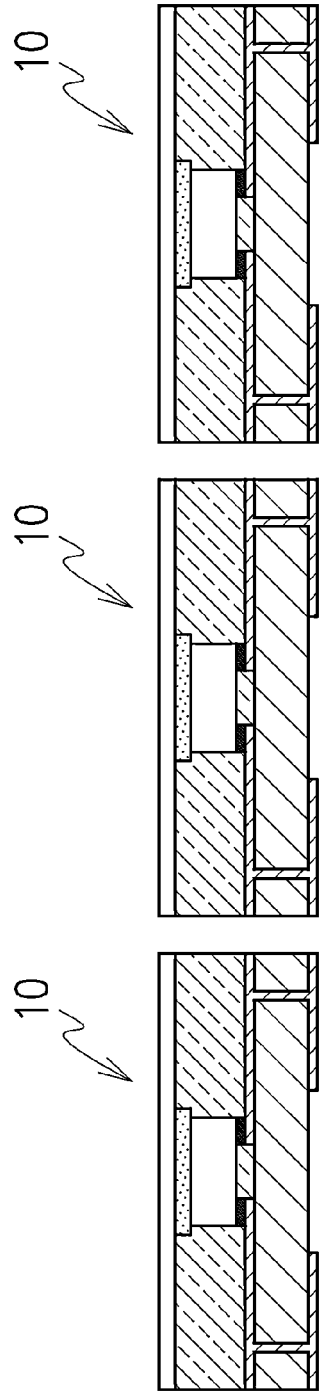

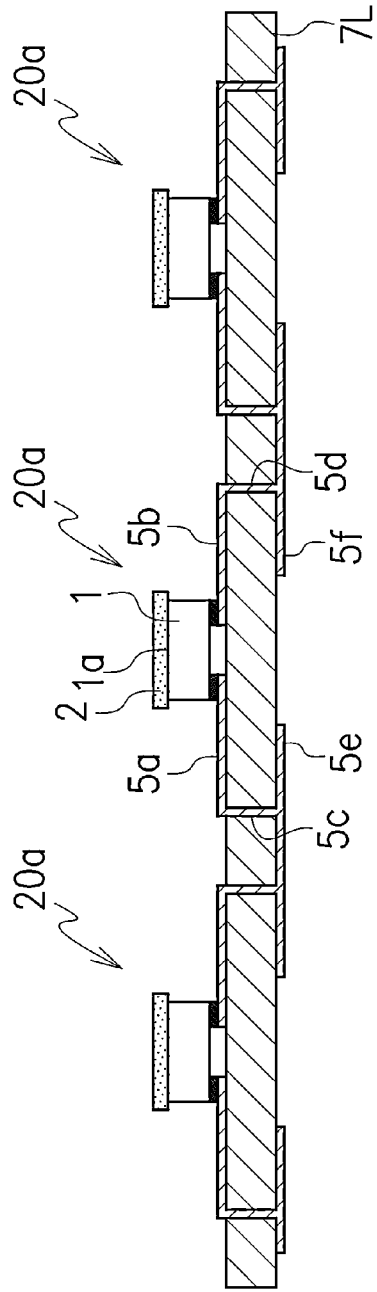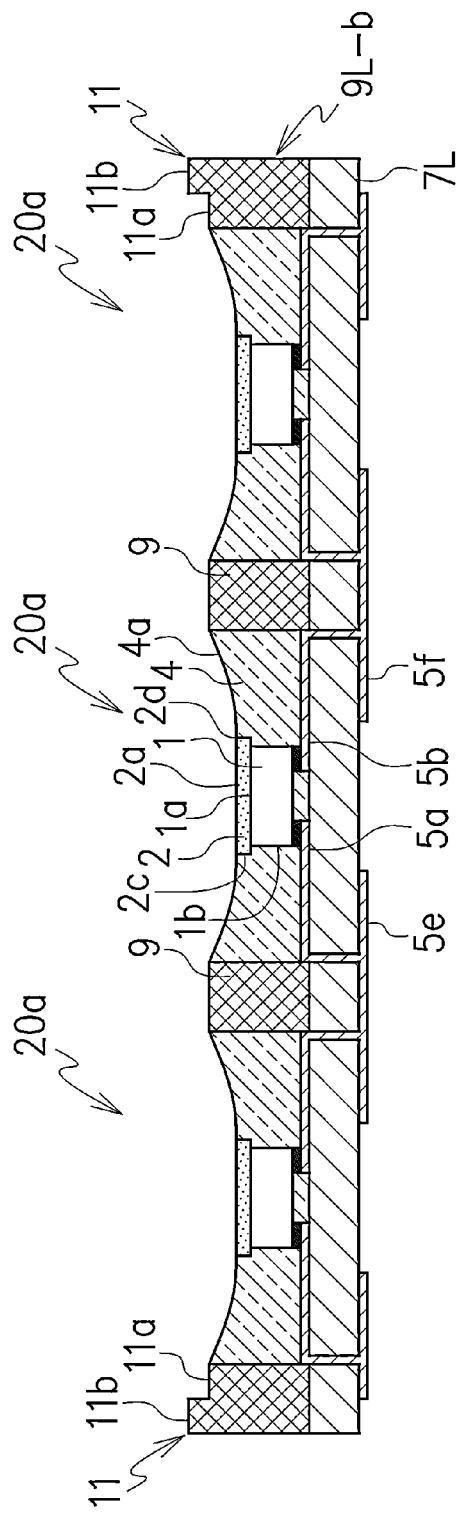

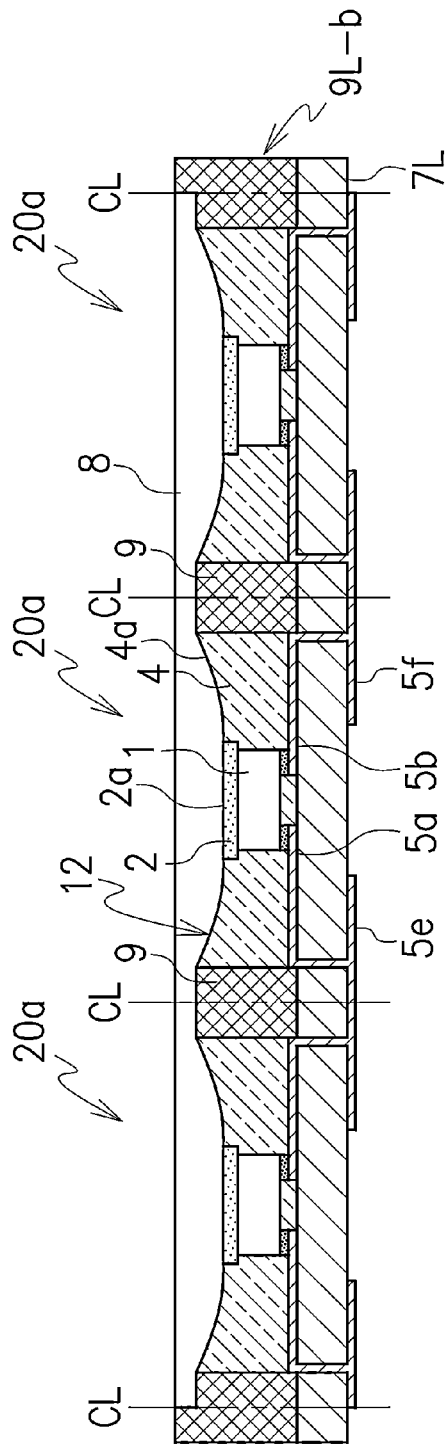
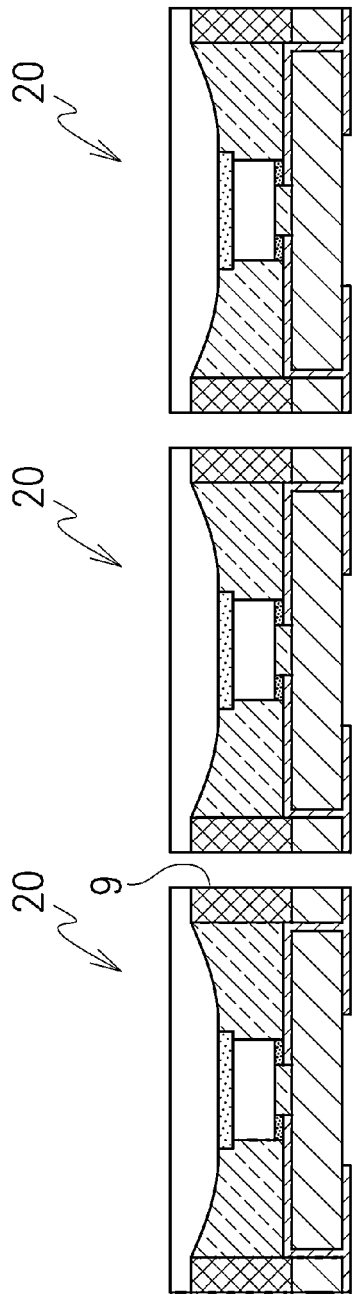

LIGHT-EMITTING DEVICE INCLUDING LED ELEMENT WHOSE UPPER SURFACE IS FREE FROM WHITE RESIN AND METHOD OF MANUFACTURING THE SAME

CROSS REFERENCE TO RELATED APPLICATION

This application is based on and claims the priority benefit of Japanese Patent Application No. 2011-135526, filed on Jun. 17, 2011, the disclosure of which is incorporated herein by reference in its entirety.

BACKGROUND OF THE INVENTION

1. Field of the Invention

The present invention relates to a light-emitting device including light-emitting elements such as LED elements and a method of manufacturing the same.

2. Description of the Related Art

In recent years, a light-emitting diode element (hereinafter referred to as LED element) generally can have a longer service life, a better drive characteristic, and further a better light-emitting efficiency as time passes. Accordingly, the LED elements have been widely used in many fields and in applications such as in color displays, illuminations, lighting systems or the like.

In particular, there are recently proposed light-emitting devices configured to gather light effectively (for reference, see JP2010-192629A and JP2007-19096A).

The conventional light-emitting devices are described hereinafter. Here, a part of drawings is simplified in a scope where these conventional light-emitting devices are not departed from a gist thereof to facilitate understanding of these inventions, and technical terms used to these conventional light-emitting devices are described in accordance with technical terms used to the present invention.

FIGS. 10A to 10D illustrate processes of manufacturing the light-emitting device 100 disclosed in JP2010-192629A.

As shown in FIG. 10A, an LED element 101 is mounted on an upper surface of a substrate 107 through a pair of conductive members 106a and 106b, and a space between a lower surface of the LED element 101 and the upper surface of the substrate 107 and a peripheral side surface of the LED element 1 is covered by a first reflective white resin 104 by filling the first reflective white resin 104 in a space surrounded by a frame body 109 on the upper surface of the substrate 107. FIG. 10B and FIG. 10C show a process of adhering a light-transmitting member 102 (transparent member or phosphor member) to an upper surface of the LED element 101 and an upper surface of the first reflective white resin 104 through a transparent adhesive 103 FIG. 10D shows a process of dropping a fluid-like second white resin 105 from a dropping device 108 on the upper surface of the substrate 7, and the fluid-like second white resin 105 covers a peripheral side surface of the first reflective white resin 104 and a peripheral side surface of the light-transmitting member 102.

FIG. 11 shows a sectional view of the light-emitting device 200 disclosed in JP2007-19096A. The light-emitting device 200 includes a case 203 having a concave portion 203a, an LED element 201 disposed in the case 203 and electrically mounted through conductive members 206a and 206b on upper electrodes 205a and 205b that are provided on a bottom surface of the concave portion 203a, a reflective white resin 204 filled in the concave portion 203a and covering a space between a lower surface of the LED element 201 and a peripheral side surface of the LED element 201. The light-emitting device further includes a sheet-like phosphor layer 202 adhered to an upper surface of the LED element 201.

SUMMARY OF THE INVENTION

The present invention is proposed in view of such conventional devices as above-described.

According to embodiments of the present invention, a light-emitting device includes a substrate, a light-emitting diode element electrically mounted on the substrate, a phosphor plate including an upper surface and a lower surface that are larger than an upper surface of the light-emitting diode element, and the lower surface of the phosphor plate adhered to the upper surface of the light-emitting diode element, a white resin provided on an upper surface of the substrate, provided to a position of an upper peripheral edge of the phosphor plate, and covering the light-emitting diode element and the phosphor plate except the upper surface of the phosphor plate, and the white resin seamlessly covering a peripheral side surface of the light-emitting diode element and a peripheral side surface of the phosphor plate.

The white resin may include an upper inner edge that is in contact with the upper peripheral edge of the phosphor plate, and an upper outer edge may be positioned outside the upper inner edge as seen in a plan view, and the upper inner edge of the white resin may be positioned at a same level as the upper outer edge of the white resin as seen in a side view, and a surface between the upper inner edge of the white resin may be a uniform flat surface with the upper surface of the phosphor plate. The light-emitting device may further include a transparent resin that covers the upper surface of the phosphor plate and the surface between the upper inner edge and the upper outer edge of the white resin, and the transparent resin may include a plate shape that fits into the uniform flat surface constituted by the upper surface of the phosphor plate and the surface between the upper inner edge and the upper outer edge of the white resin.

The white resin may include an upper inner edge that is in contact with the upper peripheral edge of the phosphor plate, and an upper outside edge may be positioned outside the upper inner edge as seen in a plan view, and the upper outside edge may be positioned at a higher position than the upper inner edge as seen in a side view, and a surface between the upper inner edge and the upper outer edge of the white resin may be a concave shape centering around the upper surface of the phosphor plate as seen in a plan view. The light-emitting device may further include a transparent resin that covers the upper surface of the phosphor plate and the surface between the upper inner edge and the upper outer edge of the white resin, and the transparent resin may include a convex shape that fits into the concave shape centering around the upper surface of the phosphor plate.

Also, a method producing a light-emitting device according to embodiments of the present invention is proposed.

BRIEF DESCRIPTION OF THE DRAWINGS

FIG. 4A is a schematic sectional view that shows disposing each one of a plurality of phosphor plates on the upper surface of each one of the LED elements that are mounted on an upper surface of a substrate assembly, when manufacturing multiple light-emitting devices as shown in FIG. 1

FIG. 4B is a schematic sectional view that shows disposing a frame body on the upper surface of the substrate assembly and disposing a white resin on the upper surface of the substrate assembly to a position of upper peripheral edges of the phosphor plates with upper surfaces of the phosphor plate free from the white resin, when manufacturing multiple light-emitting devices as shown in FIG. 1.

FIG. 4C is a schematic sectional view that shows disposing a transparent resin covering the upper surfaces of the phosphor plate and surfaces between upper inner edges each positioned around the upper surface of each one of the LED elements and an upper outer edge of the white resin, when manufacturing multiple light-emitting devices as shown in FIG. 1.

FIG. 4D is a schematic sectional view that shows cutting the transparent resin, the white resin, and the substrate assembly along central lines between the LED elements, when manufacturing multiple light-emitting devices as shown in FIG. 1.

FIG. 6 is a plan view of the light-emitting device without a frame shown in

FIG. 5.

FIG. 7A is a schematic sectional view that shows disposing each one of a plurality of phosphor plates on the upper surface of each one of the LED elements that are mounted on an upper surface of a substrate assembly, when manufacturing multiple light-emitting devices as shown in FIG. 5 and FIG. 9.

FIG. 7B is a schematic sectional view that shows disposing a frame assembly body 9L-b with frames 9 each surrounding each one of the LED elements on the upper surface of the substrate assembly, and disposing a white resin in each one of the frames on the upper surface of the substrate assembly, when manufacturing multiple light-emitting devices as shown in FIG. 5 and FIG. 9.

FIG. 7C is a schematic sectional view that shows disposing a transparent resin covering the upper surfaces of the phosphor plate and upper surfaces of the white resin, the upper surfaces each between an upper inner edge positioned around the upper surface of each one of the LED elements and an upper outer edge of each one of the white resins in the frames, when manufacturing multiple light-emitting devices as shown in FIG. 5 and FIG. 9.

FIG. 7D is a schematic sectional view that shows cutting the transparent resin, the frame, and the substrate assembly along central lines between the LED elements, when manufacturing multiple light-emitting devices as shown in FIG. 5 and FIG. 9.

DETAILED DESCRIPTION OF THE PREFERRED EMBODIMENTS

Figure 1:
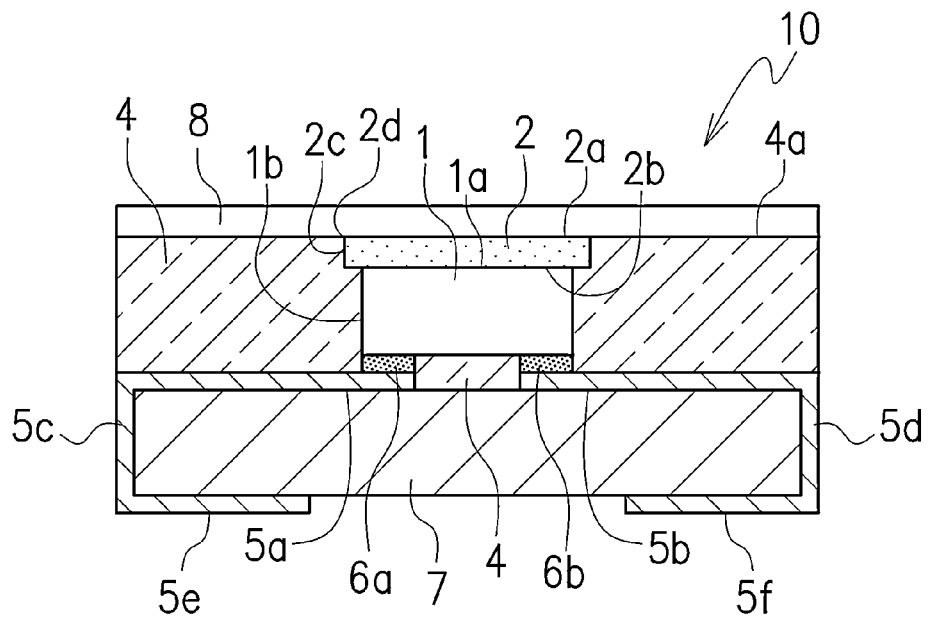
FIG. 1 is a sectional view of a light-emitting device according to a first embodiment of the present invention.

A light-emitting device 10, 20 according to the present invention includes a substrate 7, an LED element 1 electrically mounted on the substrate 7, a phosphor plate 2 that includes an upper surface 2a and a lower surface 2b each being larger than an upper surface of the LED element.

The lower surface 2b of the phosphor plate 2 has a larger area than the upper surface 1a of the LED element 1, and the lower surface 2b of the phosphor plate 2 is adhered to the upper surface 1a of the light-emitting diode element 1. The light-emitting device further includes a white resin 4 that is provided on an upper surface of the substrate 7, provided to a position of an upper peripheral edge 2d of the phosphor plate 2, and covering the light-emitting diode element 1 and the phosphor plate 2 except the upper surface 2a of the phosphor plate 2. The white resin 4 seamlessly covers a peripheral side surface 1b of the light-emitting diode element 1 and a peripheral side surface 2c of a phosphor plate 2. The white resin 4 can reflect light. Due to such a configuration, light emitted laterally from the LED element 1 can be returned to the LED element 1 by the white resin 4 seamlessly covering the peripheral side surface of the LED element 1 and the peripheral side surface 2c of the phosphor plate 2. The lower surface 2b of the phosphor plate 2 might be adhered to the upper surface 1a of the LED element 1 through a transparent adhesive 3, before the white resin 4 is provided.

Preferred embodiments of the present invention will be explained hereinafter in detail with reference to the accompanying drawings.

(First Embodiment)

Figure 2:
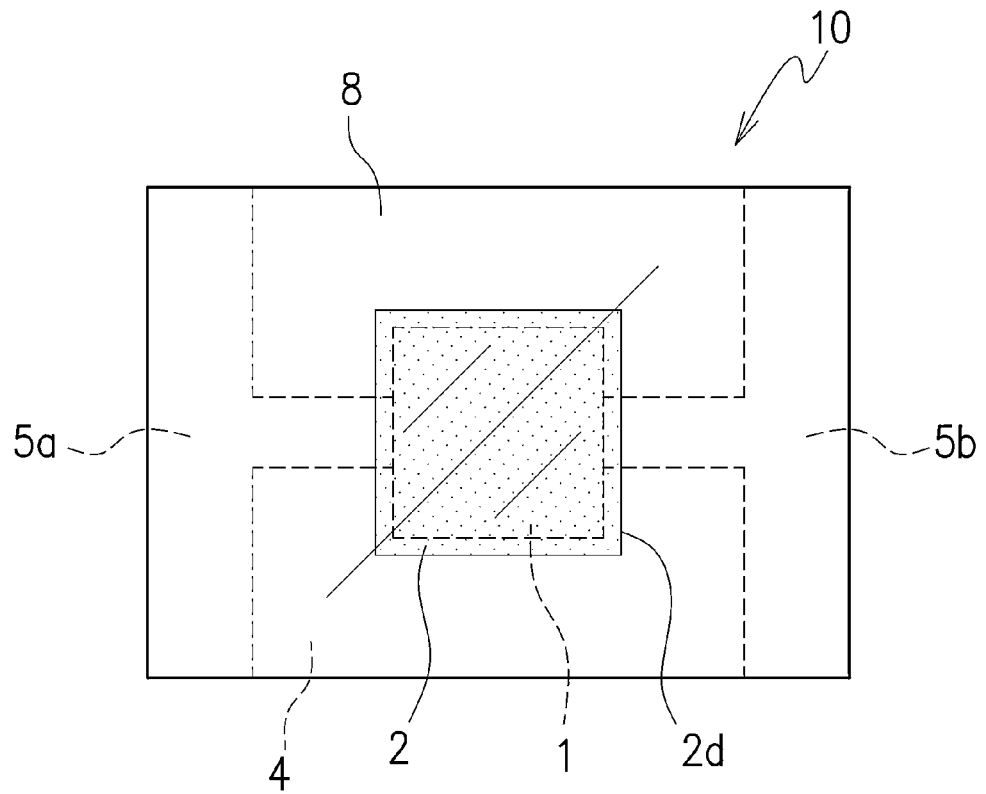
FIG. 2 is a plan view of the light-emitting device shown in FIG. 1.

A light-emitting device 10 according to the present invention is shown in FIGS. 1 to 3.

In FIGS. 1 and 2, the substrate 7 includes a pair of upper electrodes and the LED element 1 is electrically mounted on the pair of electrodes. For more details, the pair of electrodes include a first upper electrode 5a and a second upper electrode 5b that are separately disposed from each other on an upper surface of the substrate 7, a first lower electrode 5e and a second lower electrode 5f that are separately disposed from each other on the lower surface of the substrate 7. The first upper electrode 5a and the first lower electrode 5e are electrically connected, and the second upper electrode 5b and the second lower electrode 5f are electrically connected. The first upper electrode 5a and the first lower electrode 5e may be electrically connected through an electrode 5c extending from the first upper electrode 5a to the first lower electrode 5e or through a first through-hole 5c. Also, the second upper electrode 5b and the second lower electrode 5f may be electrically connected through an electrode 5d extending from the second upper electrode 5b to the second lower electrode 5f or through a second through-hole 5d. An LED (light-emitting diode) element 1 may be flipped over and mounted on the pair of upper electrodes 5a and 5b through conductive members 6a and 6b, that is a mounting technology interconnecting semiconductors, such as IC chips, LED elements, and microelectromechanical systems (MEMS) and so on to circuitry with conductive bumps. The substrate 7 may include another pair of electrodes or more, and the LED element 1 may be electrically mounted on the pair of electrodes and on another pair of electrodes or more (Flip-Chip mounting or FC mounting).

The white resin 4 provided on the upper surface of the substrate 7 may seal a space between the lower surface of the LED element and the upper surface of the substrate 7, covering a peripheral side surface 1b of the LED element 1 and a peripheral side surface 2c of the phosphor plate 2. As a result, an upper surface 2a of the phosphor plate 2 is free from the white resin 4. The white resin 4 includes an upper inner edge 4b that is in contact with the upper peripheral edge 2d of the phosphor plate 2, and an upper outer edge 4c that is positioned outside the upper inner edge 4b as seen in a plan view, and the upper inner edge 4b of the white resin 4 is positioned at a same level as the upper outer edge 4c of the white resin 4 as seen in a side view. In this embodiment, a surface between the upper inner edge 4b and the upper outer edge 4c of the white resin 4 is a uniform flat surface with the upper surface 2a of the phosphor plate 2. Due to such a configuration, as the white resin 4 that covers the peripheral side surface 1b of the LED element 1 and the peripheral surface 2c of the phosphor plate 2 can have a certain lateral thickness to seal lateral light emitted from the LED element 1.

The light-emitting device 10 further includes a transparent resin 8 that covers the upper surface 2a of the phosphor plate 2 and the surface between the upper inner edge 4b and the upper outer edge 4c of the white resin 4. In the first embodiment, the transparent resin 8 may include a plate shape that fits into the uniform flat surface constituted by the upper surface 2a of the phosphor plate 2 and the surface between the upper inner edge 4b and the upper outer edge 4c of the white resin 4.

According to the light-emitting device 10 in the aforementioned embodiment, the lower surface of the phosphor plate 2 is in contact with and larger than the upper surface 1a of the LED element 1. Also, it is preferable that the upper surface 2a of the phosphor plate 2, which is larger than the upper surface of the LED element 1, is free from the white resin 4. Accordingly, with such a configuration, even if the white resin 4 is accidentally attached or adhered to the upper surface 2a of the phosphor plate 2 over an upper peripheral edge 2d of the upper surface 2a of the phosphor plate 2 in a manufacturing process, it is possible to prevent the white resin 4 from overlapping the upper surface of the LED element 1 as seen in a plan view. As an advantageous effect of this configuration, the phosphor plate 2 can receive light emitted from the upper surface of the LED element 1 efficiently with sufficient light conversion by phosphor. Compared to conventional devices, it is more than likely possible for embodiments of the present invention to prevent a white resin disposed around an LED element in a light-emitting device from being an obstacle that shields upward light emitted from the LED element in the light-emitting device, and also possible to seal lateral light more effectively, as mentioned above.

Figure 3A:
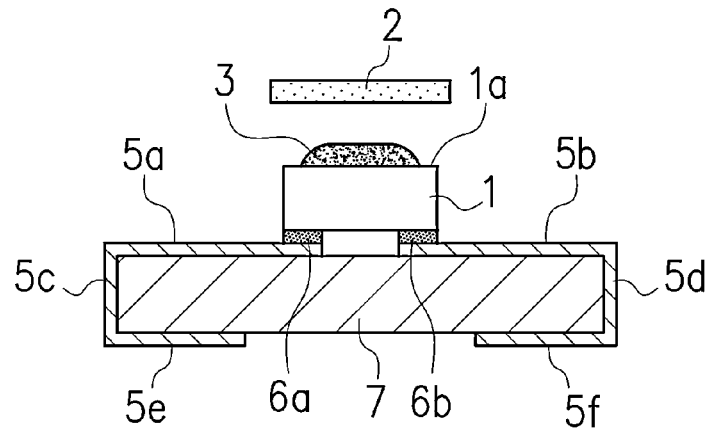
FIG. 3A is a schematic sectional view that shows disposing a phosphor plate on an upper surface of the LED element that is mounted on an upper surface of a substrate, when manufacturing alight-emitting device as shown in FIG. 1.
Figure 3B:
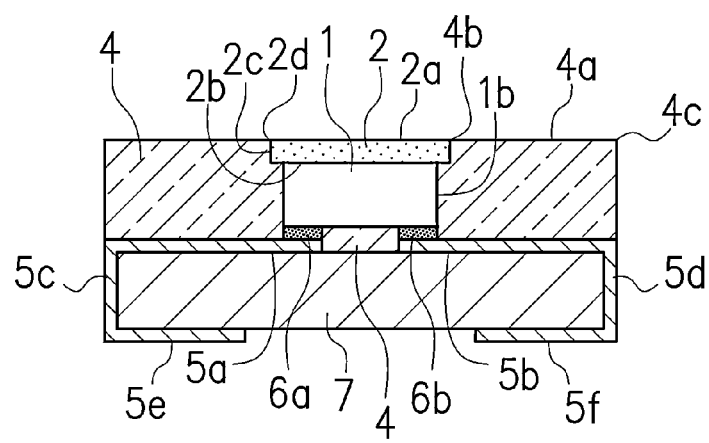
FIG. 3B is a schematic sectional view that shows disposing a white resin on the upper surface of the substrate to a position of an upper peripheral edge of the phosphor plate with an upper surface of the phosphor plate free from the white resin, when manufacturing a light-emitting device as shown in FIG. 1.
Figure 3C:
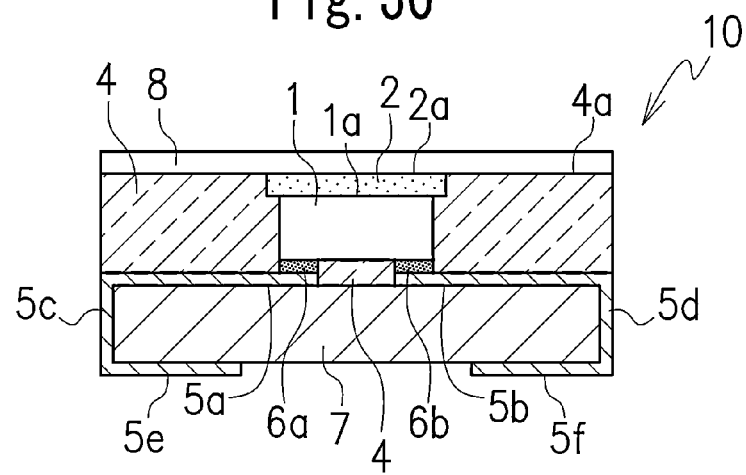
FIG. 3C is a schematic sectional view that shows disposing a transparent resin covering the upper surface of the phosphor plate and a surface between an upper inner edge positioned around the upper surface of the LED element and an upper outer edge of the white resin, when manufacturing a light-emitting device as shown in FIG. 1.

To manufacture such a light-emitting device according to the present invention, FIGS. 3A to 3C shows a manufacturing process.

According to an embodiment of the present invention, a method producing a light-emitting device 10 includes, electrically mounting a light-emitting diode element 1 on a pair of electrodes 5a, 5b that are included in a substrate 7, adhering a lower surface 2b of a phosphor plate 2 that is larger than an upper surface 1a of the light-emitting diode element 1, to the upper surface 1a of the light-emitting element 1 through a transparent adhesive 3.

First, as shown in FIG. 3A, the LED element 1 is mounted on the first upper electrode 5a and the second upper electrode 5b that are provided at an interval on the upper surface of the substrate 7 through the conductive members 6a and 6b. After the LED element 1 is mounted, the phosphor plate 2 including a lower surface that is a larger surface than the upper surface 1a of the LED element 1 is adhered to the upper surface 1a of the LED element 1 through the transparent adhesive 3. Meanwhile, the first upper electrode 5a is electrically connected to the first lower electrode 5e through a first side electrode 5c that is provided at one side surface of the substrate 7, and the second upper electrode 5b is electrically connected to the second lower electrode 5f through a second side electrode 5d that is provided at another side surface of the substrate 7. The first side electrode 5c and the second side electrode 5d may be a first through-hole that electrically connects the first upper electrode 5a and the first lower electrode 5e and may be a second through-hole that electrically connects the second upper electrode 5b and the second lower electrode 5f.

In a process shown in FIG. 3B, disposing a white resin 4 on the upper surface of the substrate 7 to seal a space between the upper surface of the substrate 7 and the lower surface of the LED element 1 and to cover the peripheral side surface 1b of the LED element 1, the peripheral side surface 2c of the phosphor plate 2 disposed on the LED element 1, and the lower surface 2b of the phosphor plate 2 that protrudes from an upper peripheral edge of the upper surface of the LED element 1. The filled white resin 4 includes an upper inner edge 4b that is in contact with the upper peripheral edge 2d of the phosphor plate 2 and an upper outer edge 4c that is positioned outside the upper inner edge 4b and the upper inner edge 4b of the white resin 4 is positioned at the same level as the upper inner edge 4b. The upper surface 4a between the upper inner edge 4b and the upper outer edge 4c of the white resin 4 is flush with the upper surface 2a of the phosphor plate 2. Meanwhile, in this process, a mold or frame providing the white resin 4 may be used, a space between a lower surface of the LED element 1 and an upper surface of the substrate 7 is also filled with the white resin 4.

For more details, the method producing a light-emitting device mentioned above further may include disposing a frame 9 that includes a step portion with a first upper surface and a second upper surface provided at an upper portion of the frame 9, on an upper surface of the substrate 7 to surround a peripheral side surface of the light-emitting diode element 1 and a peripheral side surface of the phosphor plate 2 provided on the upper surface of the light-emitting diode element 1, disposing a white resin 4 in the frame 9 in that the LED element is electrically mounted on the pair of electrodes.

Such a process of disposing a frame 9 provided on a peripheral side surface of the upper surface of the substrate 7 to surround the peripheral side surface of the LED element 1 may be added to the process shown in FIG. 3B. The frame 9 includes a step portion with a first upper surface and a second upper surface provided at an upper portion of the frame 9 that may be similar in shape to a frame body 9L-a in FIGS. 4B and 4C but may differ in size from the frame body 9L-a to surround a plurality of LED elements 1. Also, when disposing the white resin 4 in the frame 9, the white resin 4 is disposed to a position of an inner edge of a first upper surface 11a of the step portion 11 that is positioned at a same level as an upper surface 2a of the phosphor plate 2 but lower than a second upper surface 11b of the step portion 11 of the frame 9.

After disposing the white resin 4 to the position of the inner edge of the first upper surface 11a of the step portion 11 that is positioned lower than the second upper surface 11b of the step portion 11 of the frame 9, the white resin 4 is cured. Then, a transparent resin 8 is disposed on an upper surface of the cured white resin 4 and on the upper surface 2a of the phosphor plate 2, disposing the transparent resin 8 to a position of an inner edge of the second upper surface 11b of the step portion 11 of the frame 9.

Furthermore, after disposing the transparent resin 8 on the cured white resin 4 to the position of the inner edge of the second upper surface 11b of the step portion 11 of the frame 9, the transparent resin 8 is cured. After curing the transparent resin 8, the frame 9 may be removed.

As mentioned above, since the upper surface 2a and the lower surface 2b of the phosphor plate 2 are larger than the area of the light-emitting surface 1a of the LED element 1 in a plan view, even if a slight amount of the white resin 4 is attached to an adjacent upper area over the upper peripheral edge 2d of the phosphor plate 2, it is possible to prevent such an extra white resin from attaching overlapping area of the upper surface of the phosphor plate 2 and the upper surface 1a of the LED element 1 in a plan view and from shielding upward light emitted from the upper surface 1a as a light-emitting surface of the LED element 1.

Furthermore, as shown in FIG. 3A to FIG. 3C, since the upper surface 2a of the phosphor plate 2 is first adhered to the upper surface 1a of the LED element 1 and then, the white resin 4 is provided, it is possible to prevent the white resin 4 from attaching between the upper surface 1a of the LED element 1 and the lower surface 2b of the phosphor plate 2.

The covering transparent resin 8 includes a plate shape having a uniform flat surface in contact with the uniform flat surface constituted by the upper surface 2a of the phosphor plate 2 and the upper surface 4a of the white resin 4. Through such a process, the light-emitting device 10 can be manufactured.

FIGS. 4A to 4D illustrate processes of manufacturing a plurality of light-emitting devices 10 by use of a substrate assembly 7L. When electrically mounting an LED element 1 on a pair of electrodes 5a, 5b that are included in a substrate 7 as mentioned above, a substrate assembly 7L including a plurality of pairs 5a-5f of the electrodes may be used. One of a plurality of LED elements may be electrically mounted on each pair 5a-5f of the plurality of pairs of the electrodes.

First, in a process shown in FIG. 4A, by use of a substrate assembly 7L in which a plurality pairs of electrodes 5a, 5c, 5e and 5b, 5d, 5f disposed at intervals from one another, an LED element 1 is mounted on each pair of electrodes 5a, 5c, 5e and 5b, 5d, 5f. Each of a plurality of light-emitting device blocks 10a as shown in FIGS. 4A to 4D includes a pair of a first upper electrode 5a and a second upper electrode 5b, a pair of a first through-hole 5c and a second through-hole 5d, and a pair of a first lower electrode 5e and a second lower electrode 5f. In each light-emitting device block 10a, the LED element 1 may be mounted on the pair of upper electrodes 5a and 5b provided on the substrate assembly 7L by FC mounting, and then, a phosphor plate 2 may be adhered to an upper surface 1a of each one of the LED elements 1 through an adhesive. Here, each one of the phosphor plates 2 has an area larger than that of the upper surface 1a of the LED element 1 in a plan view.

Also, when disposing the frame 9 that includes the step portion 11 as mentioned above, a frame body 9L-a that includes one opening and a step portion 11 provided at an upper portion of the frame body 9L-a around the opening may be disposed on an upper surface of the substrate assembly 7L. The frame body 9L-a may be disposed to surround the plurality of light-emitting diode elements 1 and the phosphor plates 1 each adhered to an upper surface of each one of the light-emitting diode elements 1.

Furthermore, when disposing the white resin 4 in the frame 9, as above mentioned, the white resin 4 may be disposed in the opening of the frame body 9L-a disposed on the upper surface of the substrate assembly 7L, and the white resin 4 may be disposed to a position of an inner edge of the first upper surface 11a of the step portion 11. The first upper surface 11a is positioned lower than the second upper surface 11b of the step portion 11.

In a process shown in FIG. 4B, a frame body 9L-a having approximately a rectangular outer shape similar to or slightly smaller than an outline of the substrate assembly 7L is disposed on the upper surface of the substrate assembly 71, and the plurality of LED elements 1 disposed at intervals from one another and on each of which the phosphor plate 2 is disposed and are arranged on the substrate assembly 7L to be contained in the frame body 9L-a. That is to say, each of the light-emitting device blocks 10a is disposed in the frame body 9L-a. The step portion 11 includes a first upper surface 11a and a second upper surface 11b that is provided at a position above a level the first upper surface 11a. A level position of the first upper surface 11a is approximately the same as the upper surface 2a of the phosphor plate 2 adhered to the upper surface 1a of the LED element 1. The frame body 9L-a includes an opening, surrounding a plurality of LED elements 1, and a step portion 11 that is provided at an upper portion of the frame body 9L-a around the opening. The step portion 11 includes a first upper surface 11a that is positioned at a same level as an upper surface 2a of the phosphor plate 2, and a second upper surface 11b that is positioned higher than the first upper surface 11a of the step portion 11.

An interior of the frame body 9L-a is filled with a white resin 4, which seals peripheral side surface 1b of each of the plurality of LED elements 1 and a peripheral side surface 2c of each of the phosphor plate 2. The frame body 9L-a is filled with the white resin 4 to a level of the first upper surface 11a of the step portion 11 of the frame body 9L-a. The peripheral side surfaces 1b of the LED elements 1 and the peripheral side surfaces 2c of the phosphor plates 2 are covered with the white resin 4 at one time, while the upper surfaces 2a of the phosphor plates 2 are not covered with the white resin 4 and in an exposed state.

After the white resin 4 is cured, a transparent resin 8 may be disposed to the position of the inner edge of the second upper surface 11b of the step portion 11 of the frame body 9L-a. A plurality of light-emitting diode device may be obtained by dicing the transparent resin 8, the white resin 4, and the substrate assembly 7L along central lines (CL) between the LED elements 1.

In a process shown in FIG. 4C, the transparent resin 8 is provided on the flat surface constituted by upper surfaces of the phosphor plates and an upper surface of the white resin 4, and the transparent resin 8 is provided to a level of the second upper surface 11b. By filling the transparent resin 8 as mentioned above, the upper surface 2a of the phosphor plate 2 and the upper surface 4a of the white resin 4 can be covered with the transparent resin at one time.

In a process shown in FIG. 4D, as shown in FIG. 4C, a plurality of light-emitting devices 10 are separated by dicing the transparent resin 8, the white resin 4, and the substrate assembly 7L along lines CL. The plurality of light-emitting devices 10 each being shown in FIG. 1 can be acquired.

(Second Embodiment)

Figure 5:
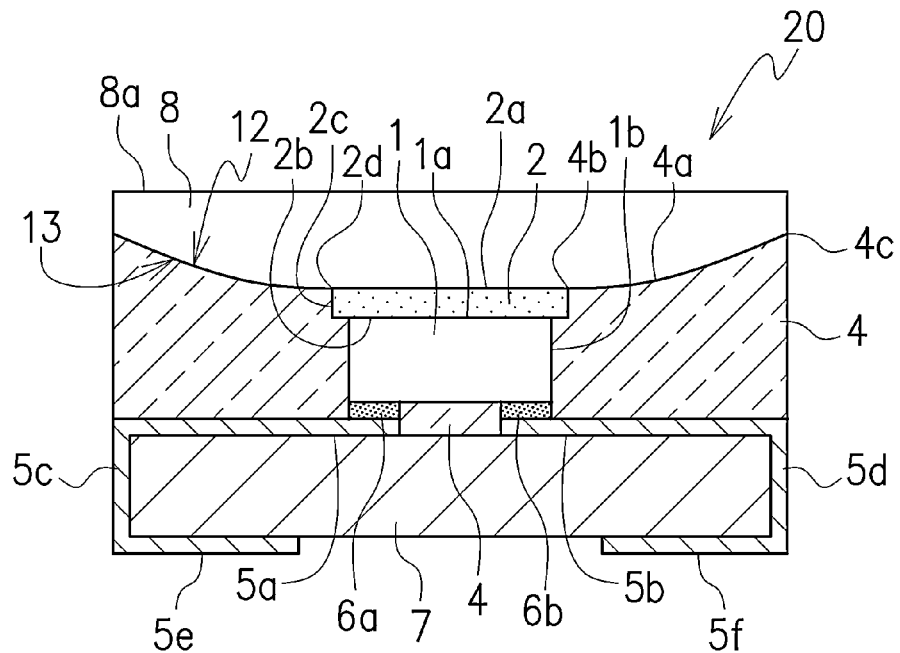
FIG. 5 is a sectional view showing a light-emitting device according to a second embodiment of the present invention.
Figure 6:
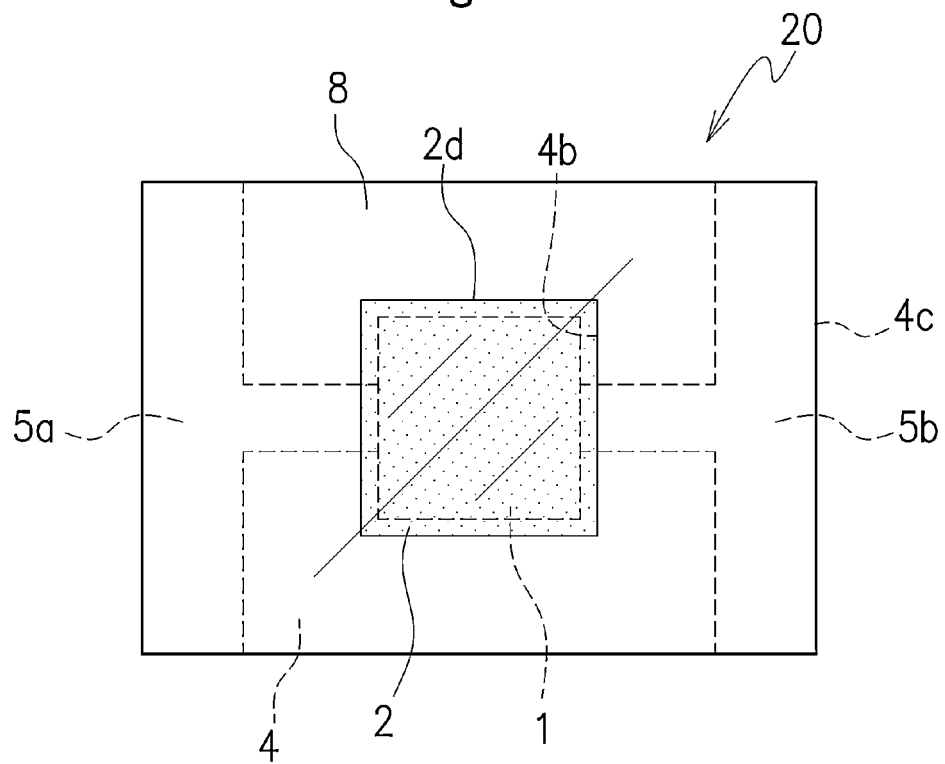

A light-emitting device 20, as shown in FIG. 5, according to a second embodiment of the present invention is similar to the light-emitting device 10 according to the first embodiment. A light-emitting device 20 includes a substrate 7, an LED element 1 electrically mounted on the substrate 7, a phosphor plate 2 that includes an upper surface 2a and a lower surface 2b each being larger than an upper surface of the LED element. The lower surface 2b of the phosphor plate 2 has a larger area than the upper surface 1a of the LED element 1, and the lower surface 2b of the phosphor plate 2 is adhered to the upper surface 1a of the light-emitting diode element 1.

The main differences between the light-emitting device 10 and the light-emitting device 20 are the shapes of a white resin 4 and a transparent resin 8 disposed on the white resin 4. The white resin 4 according to the second embodiment of the present invention includes an upper inner edge 4b that is in contact with the upper peripheral edge 2d of the phosphor plate 2 and an upper outer edge 4c that is positioned at a higher position than the upper inner edge 4b as seen in a side view, and a surface between the upper inner edge 4b and the upper outer edge 4c of the white resin 4 is a concave shape centering around the upper surface 2a of the phosphor plate 2 as seen in a plan view.

The light-emitting device 20 according to the second embodiment further may include a transparent resin 8 that covers the upper surface 2a of the phosphor plate 2 and the surface between the upper inner edge 4b and the upper outer edge 4c of the white resin 4. The transparent resin 8 may include a convex shape that fits into the concave shape centering around the upper surface of the phosphor plate.

The light-emitting device 20 according to the second embodiment has the same advantageous effect as that of the light-emitting device 10 according to the first embodiment. In addition, the light-emitting device 20 has advantageous effect that a light-focusing property to an upper direction can be further enhanced, because the upper surface 4a of the white resin 4 includes the curved concave surface 12 and the transparent resin 8 includes the lens-like convex surface that fits into the concave shape 12 centering around the upper surface 2a of the phosphor plate 2.

According to a manufacturing method of a light-emitting device 20 of the second embodiment of the present invention as shown in FIG. 7A-7D, when disposing the white resin 4 in the frame 9 as mentioned above, the white resin 4 may be disposed so that the white resin 4 includes a concave shape centering around the upper surface of the phosphor plate in each frame 9 of the frame assembly body 9L-b. After that, the white resin may be cured. Then, a transparent resin 8 may be disposed on the cured white resin 4 at the concave shape centering around the upper surface 2a of the phosphor plate 2 so that the transparent resin 8 includes a convex shape that fits into the concave shape of the white resin 4. When disposing the white resin 4 in the frame 9, a molding die with a curving surface to shape the white resin 4 to include the concave shape may be used.

FIGS. 7A to 7D illustrate a method of manufacturing a plurality of light-emitting device blocks 20a each being the same as or similar to the light-emitting device 20 by use of a substrate assembly 7L. The manufacturing method in this embodiment includes electrically mounting one of a plurality of LED elements 1 on each pair 5a, 5c, 5e and 5b, 5d, 5f of plurality pairs of electrodes, which are arranged at intervals on the substrate assembly 7L. The LED elements 1 each may be electrically mounted on each pair of plurality pairs of electrodes through a pair of conductive members. A plurality of phosphor plates 2 each may be mounted on an upper surface of each of the LED elements 1. Also, when disposing the frame 9 that includes the step portion 11 as mentioned above, a frame assembly body 9L-b including a step portion 11 at an upper portion of a rectangular outline of the frame assembly body 9L-b and including a plurality of frames 9 that are arranged in a shape of lattice in the rectangular outline of the frame assembly body 9L-b may be provided.

Also, when disposing the white resin 4 in the frame 9 as mentioned above, the white resin 4 may be disposed in the frames 9 of the frame assembly body 9L-b and disposed to a position of an inner edge of a first upper surface 11a of the step portion 11 that is positioned higher than upper surfaces 2a of the phosphor plates 2 but lower than a second upper surface 11b of the step portion 11 of the frame assembly body 9L-b so that the white resin 4 in each frame 9 includes a concave shape centering around the upper surface 2a of the phosphor plate 2 provided on each of the light-emitting diode element 1, curing the white resin. Furthermore, a transparent resin 8 may be disposed on the cured white resin 4 at the concave shape centering around the upper surface 2a of the phosphor plate 2 so that the transparent resin 8 includes a convex shape that fits into the concave shape of the white resin 4. Then, the transparent resin 8 may be cured and a plurality of light-emitting diode devices 20 can be obtained by dicing at frames along central lines (CL) between the light-emitting diode elements as shown in FIG. 7D.

FIG. 7A illustrates a plurality of light-emitting device blocks 20a. Each of the plurality of light-emitting device blocks 20a includes the pair of a first upper electrode 5a and a second upper electrode 5b, the pair of a first through-hole 5c and a second through-hole 5d and the pair of a first lower electrode 5e and a second lower electrode 5f as similar to other embodiments mentioned above. The manufacturing method according to this embodiment includes electrically mounting one of a plurality of LED elements 1 on each pair of the plurality of pairs of electrodes on the substrate assembly 7L, and a phosphor plate 2 is adhered to an upper surface of each one of the LED elements 1 as similar to other embodiments mentioned above through a transparent adhesive.

In a process as shown in FIG. 7B, the frame assembly body 9L-b including the plurality of frames 9 separating the light-emitting device blocks 20a is disposed to surround each light-emitting device block 20a by the frames 9 of the frame assembly 9L-b. At this time, each one of LED elements 1 is surrounded by each frame 9 of the plurality of frames 9 of the frame assembly body 9 with a step portion 11 that is provided on the upper portion of an outer rectangular outline frame portion of the frame assembly body 9. The step portion 11 includes a first upper surface 11a and a second upper surface 11b positioned at a higher level than the first upper surface 11a, similar to the above, a height position of the first upper surface 11a is approximately the same as an upper surface of frames 9. Thus, an interior of each of the light-emitting device blocks 20a surrounded by each frame 9 of the frame assembly 9L-b is filled with the white resin 4 to seal the LED elements 1. When the interior of each light-emitting device block 20a is filled with the white resin 4, a central portion thereof is filled to an upper peripheral edge 2d of the phosphor plate 2, while a peripheral portion thereof is filled to a level of the upper surface of the frame assembly 9L-b or the first upper surface 11a, thereby the curved concave surface 12 which has at the central portion a low height and at the peripheral portion a height gradually increased from the central portion is formed. By this filling, the side surface of the LED element 1 and the side surface of the phosphor plate 2 are covered with the white resin 4, while the upper surface 2a of the phosphor plate 2 is in an exposed state.

As a method of filling the white resin 4, for example, a dropping device to drop a fluid-like white resin to a predetermined level or a mold forming a white resin in a curved shape may be used.

In the process shown in FIG. 7C, the frame assembly 9 disposed to surround the outer peripheral edge of the substrate assembly 7L is filled with the transparent resin 8 to a level of the second upper surface 11b, and the upper surface of the phosphor plate 2 and the upper surface of the white resin 4 are covered with the transparent resin 8.

In the process shown in FIG. 7D, the plurality of light-emitting device blocks 20a are separated into the light-emitting devices 20 by cutting the frame assembly body 9L-b along a central line CL of each frame of the frame assembly body 9L-b which partitions the light-emitting device blocks 20a. By the separation process, a plurality of light-emitting devices 20 can be acquired.

Figure 8:
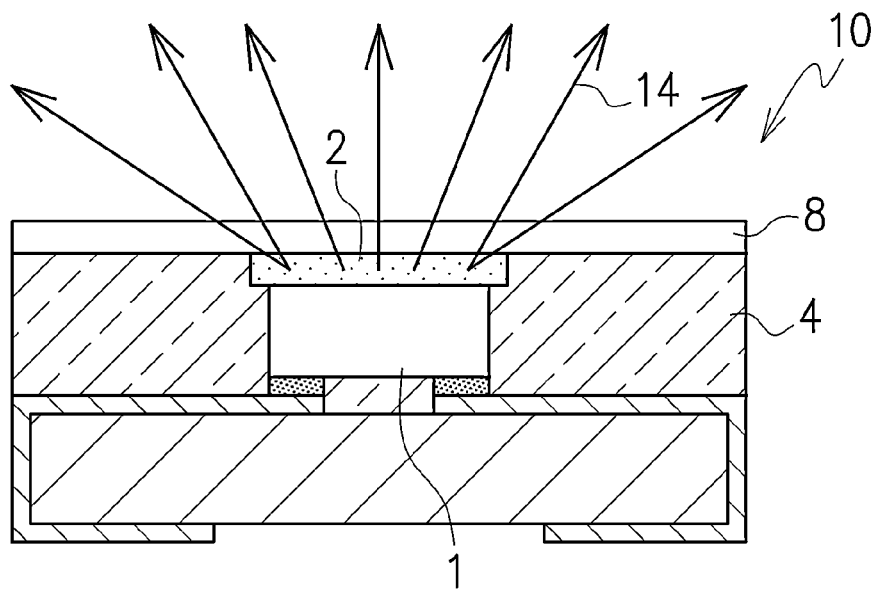
FIG. 8 is a schematic sectional view showing a light-emitting characteristic of the light-emitting device as shown in FIG. 1.
Figure 9:
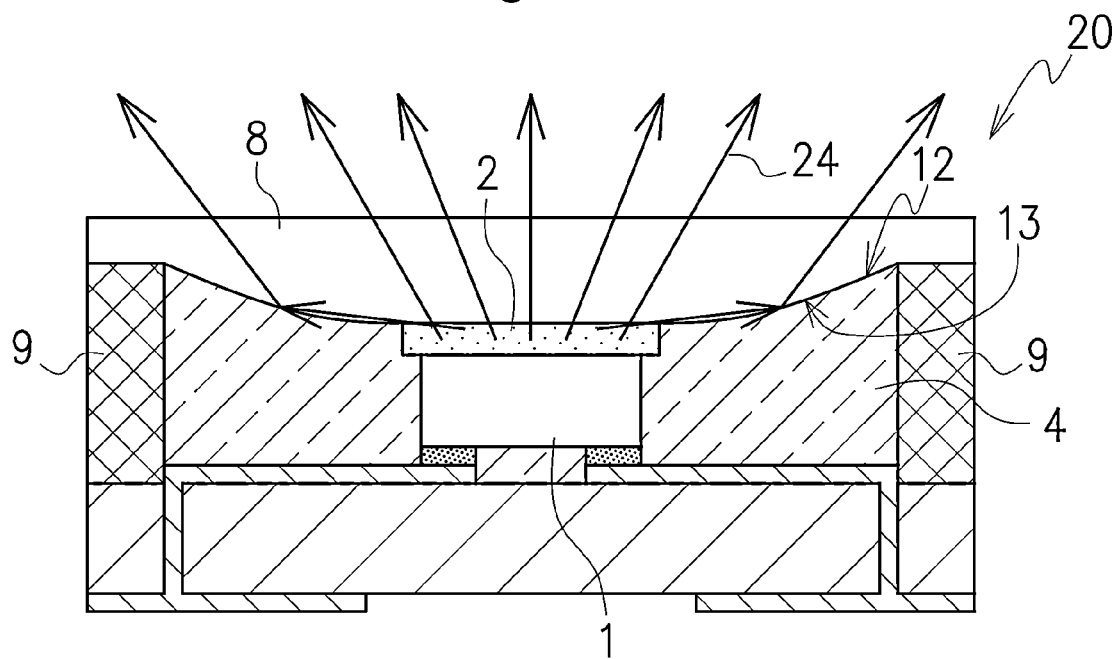
FIG. 9 is a schematic sectional view of a modified example of the light-emitting device with a frame according to the second embodiment as shown in FIG. 5, showing a light-emitting characteristic of the light-emitting device mounted on a frame.
Figure 10A:
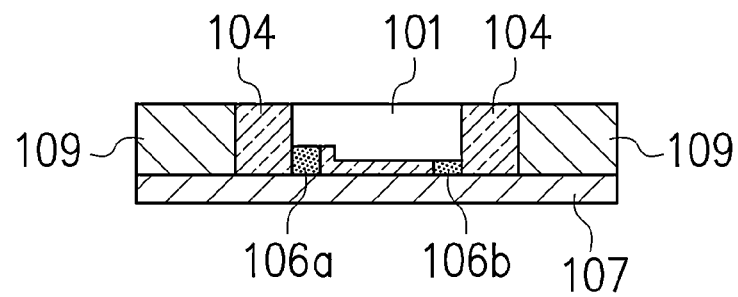
FIG. 10A is a schematic sectional view that shows providing a first white resin to seal a peripheral side surface of an LED element that is mounted on a substrate, when manufacturing a conventional light-emitting device.
Figure 10B:
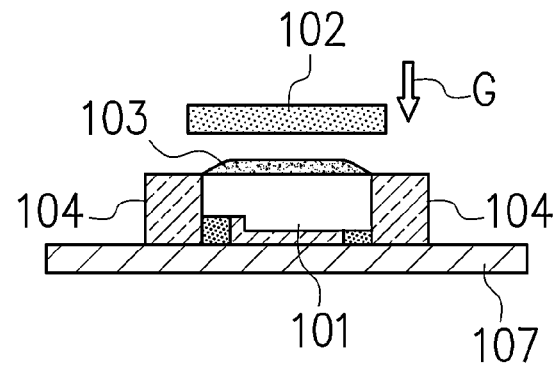
FIG. 10B and FIG. 10C are schematic sectional views that show applying a transparent adhesive on an upper surface of the LED element and adhering a light-transmitting member onto the upper surface of the LED element and the upper surface of the first white resin, when manufacturing the conventional light-emitting device.
Figure 10C:
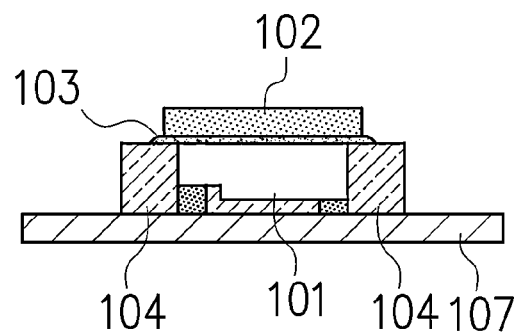
Figure 10D:
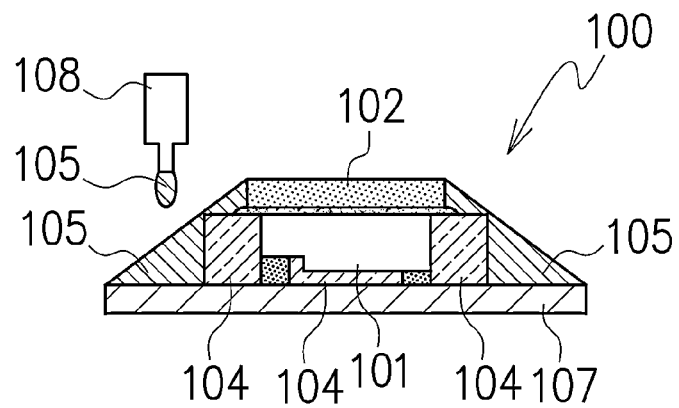
FIG. 10D is a schematic sectional view that shows covering a peripheral side surface of the light-transmitting member, the first white resin and an upper surface of the substrate with a second white resin, when manufacturing the conventional light-emitting device.
Figure 11:
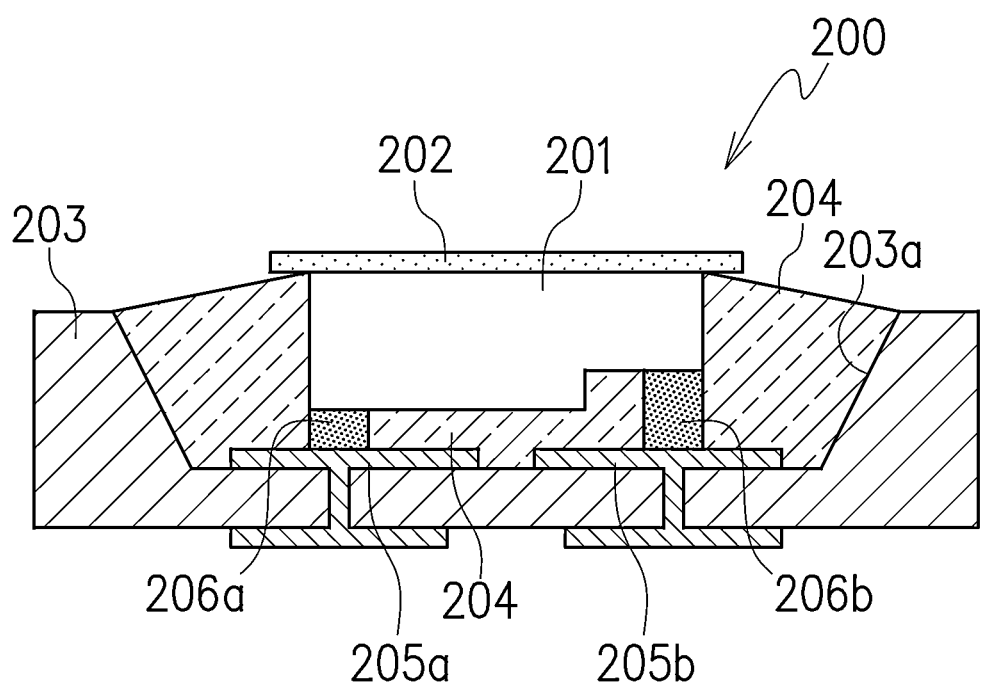
FIG. 11 is a sectional view of another conventional light-emitting device.

FIGS. 8 and 9 illustrate a light-emitting characteristic of each of the light-emitting devices 10 and 20.

In the light-emitting device 10 shown in FIG. 8, light emitted from the LED element 1 is gathered upwardly by the white resin 4 and emitted as widely diffused light 14 from the phosphor plate 2 having a larger area than that of the upper surface of the LED element 1. On the other hand, in the light-emitting device 20 shown in FIG. 9, light gathered upwardly by the white resin 4 is emitted as light 24 gathered in a narrower range than that of the light-emitting device 8 shown in FIG. 8 by the concave surface 12 of the white resin 4 and the lens-like convex surface 13 of the transparent resin 8.

As mentioned above, in each of the light-emitting devices 10 and 20 according to the present invention, because the phosphor plate 2 having a larger area than that of the upper surface 1a of the LED element 1 is disposed on the upper surface 1a of the LED element 1, even if the white resin 4 is attached to the upper peripheral edge 2d of the phosphor plate 2 to a certain degree, when covering the peripheral side surface 1b of the LED element 1 and the peripheral side surface 2c of the phosphor plate 2 with the white resin 4 by the filling thereof, the attachment has no affection to the upper surface, that is, light-emitting surface of the LED element. Moreover, by covering the upper surface of the phosphor plate 2 and the upper surface of the white resin 4 with the transparent resin 8, the phosphor plate 2 or the white resin 4 can be prevented from being dirty and deteriorating.

Furthermore, because the white resin 4 has at the upper surface thereof a reflective shape and the transparent resin 8 has a shape of lens effect, upward light-gathering property of emitted light can be improved further.

Although the preferred embodiments of the present invention have been described, it should be understood that the present invention is not limited to these embodiments, various modifications and changes can be made to the embodiments.

What is claimed is:

1. A method producing a light-emitting device comprising:
   electrically mounting a light-emitting diode element on a pair of electrodes that are included in a substrate;
   adhering a lower surface of a phosphor plate that is larger than an upper surface of the light-emitting diode element, to the upper surface of the light-emitting element through a transparent adhesive;
   disposing a frame that includes a step portion with a first upper surface and a second upper surface provided at an upper portion of the frame, on an upper surface of the substrate to surround a peripheral side surface of the light-emitting diode element and a peripheral side surface of the phosphor plate provided on the upper surface of the light-emitting diode element;
   disposing a white resin in the frame.

2. The method producing a light-emitting device according to claim 1 comprising:
   when disposing the white resin in the frame, disposing the white resin to a position of an inner edge of the a first upper surface of the step portion that is positioned at a same level as an upper surface of the phosphor plate but lower than the a second upper surface of the step portion of the frame.

3. The method producing a light-emitting device according to claim 2 comprising: after disposing the white resin to the position of the inner edge of the first upper surface of the step portion that is positioned lower than the second upper surface of the step portion of the frame,
   curing the white resin; and
   disposing a transparent resin on an upper surface of the cured white resin and on the upper surface of the phosphor plate, disposing the transparent resin to a position of an inner edge of the second upper surface of the step portion of the frame.

4. The method producing a light-emitting device according to claim 3 comprising:
   after disposing the transparent resin on the cured white resin to the position of the inner edge of the second upper surface of the step portion of the frame, curing the transparent resin; and
   removing the frame.

5. The method producing a light-emitting device according to claim 1 comprising:
   when electrically mounting the light-emitting diode element on the pair of electrodes that are included in the substrate of claim 1, using a substrate assembly including a plurality of pairs of the electrodes, and electrically mounting one of a plurality of light-emitting diode elements on each pair of the plurality of pairs of the electrodes;
   when disposing the frame that includes the step portion of claim 1, disposing a frame body that includes one opening and a step portion provided at an upper portion of the frame body around the opening, on an upper surface of the substrate assembly, disposing the frame body on the upper surface of the substrate assembly to surround the plurality of light-emitting diode elements and the phosphor plates each adhered to each one of the plurality of light-emitting diode elements;
   when disposing the white resin in the frame of claim 1, disposing the white resin in the opening of the frame body disposed on the upper surface of the substrate assembly, disposing the white resin to a position of an inner edge of the first upper surface of the step portion, the first upper surface that is positioned lower than the second upper surface of the step portion.

6. The method producing a light-emitting device according to claim 3 comprising:
   after disposing the transparent resin to the position of the inner edge of the second upper surface of the step portion of the frame, curing the transparent resin; and dicing along central lines between the light-emitting diode elements to obtain a plurality of light-emitting diode devices.

7. The method producing a light-emitting device according to claim 1 comprising:
when disposing the white resin in the frame of claim 1, disposing the white resin so that the white resin includes a concave shape centering around the upper surface of the phosphor plate;
curing the white resin; and
disposing a transparent resin on the cured white resin at the concave shape centering around the upper surface of the phosphor plate so that the transparent resin includes a convex shape that fits into the concave shape of the white resin.

8. The method producing a light-emitting device according to claim 6 comprising:
when disposing the white resin in the frame of claim 6, using a molding die with a curving surface to shape the white resin to include the concave shape.

9. The method producing a light-emitting device according to claim 1 comprising:
when disposing the frame that includes the step portion of claim 1, disposing a frame assembly body including a step portion at an upper portion of a rectangular outline of the frame assembly body and including a plurality of frames that are arranged in a shape of lattice in the rectangular outline of the frame assembly body;
when disposing the white resin in the frame of claim 1, disposing the white resin in the frames of the frame assembly body, disposing the white resin to a position of an inner edge of a first upper surface of the step portion that is positioned higher than upper surfaces of the phosphor plates but lower than a second upper surface of the step portion of the frame assembly body so that the white resin in each frame includes a concave shape centering around the upper surface of the phosphor plate provided on each of the light-emitting diode element, curing the white resin;
disposing a transparent resin on the cured white resin at the concave shape centering around the upper surface of the phosphor plate so that the transparent resin includes a convex shape that fits into the concave shape of the white resin; curing the transparent resin; and
dicing at frames between the light-emitting diode elements to obtain a plurality of light-emitting diode devices.

* * * * *

UNITED STATES PATENT AND TRADEMARK OFFICE
CERTIFICATE OF CORRECTION

| | |
|---|---|
| PATENT NO. | : 8,836,208 B2 |
| APPLICATION NO. | : 13/525934 |
| DATED | : September 16, 2014 |
| INVENTOR(S) | : Kazuya Ishihara et al. |

Page 1 of 1

It is certified that error appears in the above-identified patent and that said Letters Patent is hereby corrected as shown below:

In the Claims

At Claim 2, column 12, line 14, delete "a" before "first"
At Claim 2, column 12, line 17, delete "a" before "second"

Signed and Sealed this
First Day of December, 2015

Michelle K. Lee
*Director of the United States Patent and Trademark Office*